(12) United States Patent
Kim et al.

(10) Patent No.: US 7,663,443 B2
(45) Date of Patent: Feb. 16, 2010

(54) ACTIVE BALUN CIRCUIT

(75) Inventors: Moon Sun Kim, Gyunggi-Do (KR); Yoo Sam Na, Seoul (KR); Hyeon Seok Hwang, Gyunggi-Do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 0 days.

(21) Appl. No.: 12/197,150

(22) Filed: Aug. 22, 2008

(65) Prior Publication Data
US 2009/0051440 A1 Feb. 26, 2009

(30) Foreign Application Priority Data
Aug. 23, 2007 (KR) .................. 10-2007-0084918

(51) Int. Cl.
*H03F 3/04* (2006.01)

(52) U.S. Cl. .................. 330/301; 330/258; 330/253

(58) Field of Classification Search .................. 330/301, 330/258, 253
See application file for complete search history.

(56) References Cited

U.S. PATENT DOCUMENTS

| | | | | |
|---|---|---|---|---|
| 5,281,924 A | * | 1/1994 | Maloberti et al. | 330/253 |
| 5,376,899 A | * | 12/1994 | Pass | 330/253 |
| 5,475,323 A | * | 12/1995 | Harris et al. | 327/67 |
| 6,021,323 A | * | 2/2000 | Vagher | 455/324 |
| 6,057,714 A | | 5/2000 | Andrys et al. | |
| 6,768,352 B1 | * | 7/2004 | Maher et al. | 327/112 |
| 7,088,185 B2 | * | 8/2006 | Rofougaran | 330/301 |

FOREIGN PATENT DOCUMENTS

KR 1999-20110 A 3/1999

\* cited by examiner

*Primary Examiner*—Patricia Nguyen
(74) *Attorney, Agent, or Firm*—Lowe Hauptman Ham & Berner

(57) ABSTRACT

There is provided an active balun circuit including: a load circuit unit including a first and a second load; a differential amplifying unit including a first amplifying unit connected to the first load, and a second amplifying unit connected to the second load and forming a differential amplifying unit together with the first amplifying unit, the differential amplifying unit differentially amplifying an input signal, and outputting first and second output signals out-of-phase with each other through first and second output terminals, respectively; a current source connected between a ground and a common connection node of the first and second amplifying units, and maintaining a constant amount of current flowing through the differential amplifying unit; and a compensation amplifying unit amplifying the input signal supplied through the input terminal, transmitting the amplified input signal to the second amplifying unit, and rejecting common mode noise of the differential amplifying unit.

3 Claims, 2 Drawing Sheets

ACTIVE BALUN CIRCUIT

CROSS-REFERENCE TO RELATED APPLICATIONS

This application claims the priority of Korean Patent Application No. 2007-0084918 filed on Aug. 23, 2007, in the Korean Intellectual Property Office, the disclosure of which is incorporated herein by reference.

BACKGROUND OF THE INVENTION

1. Field of the Invention

The present invention relates to active balun circuits, and more particularly, to an active balun circuit that can improve symmetry between two complementary output signals by rejecting common-mode noise.

2. Description of the Related Art

In general, balun circuits convert single input signals (unbalanced signals) into differential output signals (balanced signals) or vice versa. The balun circuit is divided into a passive balun having passive elements and an active balun having active elements according to which elements constitute the balun circuit.

FIG. 1 is a configuration view illustrating an active balun circuit according to the related art.

An active balun circuit, shown in FIG. 1, according to the related art includes a load circuit unit 10, a differential amplifying unit 20, and a current source 30. The load circuit unit 10 includes a first load LD1 and a second load LD2 that are connected in parallel with a power supply Vdd. The differential amplifying unit 20 includes a first MOS transistor M1 and a second MOS transistor M2. The first MOS transistor M1 has a drain connected to the first load LD1 of the load circuit unit 10 and a gate connected to an input terminal IN. The differential amplifying unit 20 has a drain connected to the second load LD2 of the load circuit unit 10, a gate connected to a ground, and a source connected to a source of the first MOS transistor M1. The current source 30 is connected between a common connection node of the sources of the first and second MOS transistors M1 and M2 of the differential amplifying unit 20, and maintains a constant current flowing through the differential amplifying unit 20.

In the active balun circuit according to the related art, when a signal that is input through the input terminal IN passes through the first and second MOS transistors M1 and M2, a phase of the input signal is inverted. A signal that is in phase with the input signal is output through a first output terminal OUT1 connected to the drain of the first MOS transistor M1. On the other hand, a signal that is out-of-phase with the input signal is output through a second output terminal OUT2 connected to the drain of the second MOS transistor M2.

The two output signals travel along different signal transmission paths from the input terminal IN to the first output terminal OUT1 and the second terminal OUT2. The output signals have different phase and amplitude shifts due to different parasitic capacitance components or different impedances along the different signal transmission paths. As a result, symmetry between the two output signals is deteriorated.

SUMMARY OF THE INVENTION

An aspect of the present invention provides an active balun circuit that can improve symmetry between two complementary output signals by rejecting common mode noise.

According to an aspect of the present invention, there is provided a an active balun circuit including: a load circuit unit including a first load and a second load connected in parallel to a power supply terminal; a differential amplifying unit including a first amplifying unit connected to the first load of the load circuit unit, and a second amplifying unit connected to the second load of the load circuit unit and forming a differential amplifying unit together with the first amplifying unit, the differential amplifying unit differentially amplifying an input signal supplied through an input terminal, and outputting first and second output signals out-of-phase with each other through first and second output terminals, respectively; a current source connected between a ground and a common connection node of the first and second amplifying units, and maintaining a constant amount of current flowing through the differential amplifying unit; and a compensation amplifying unit amplifying the input signal supplied through the input terminal, transmitting the amplified input signal to the second amplifying unit, and rejecting common mode noise of the differential amplifying unit.

The first amplifying unit may include a first MOS transistor having a drain connected to the first load of the load circuit unit, a gate connected to the input terminal through a capacitor, and a source connected to the common connection node, and the second amplifying unit may include a second MOS transistor having a drain connected to the second load of the load circuit unit, a gate connected to the compensation amplifying unit, and a source connected to the common connection node.

The compensation amplifying unit may include a third load connected between the power supply terminal and the gate of the second MOS transistor; and a third MOS transistor having a drain connected to the gate of the second MOS transistor, a gate connected to the input terminal through a capacitor, and a source connected to a ground.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
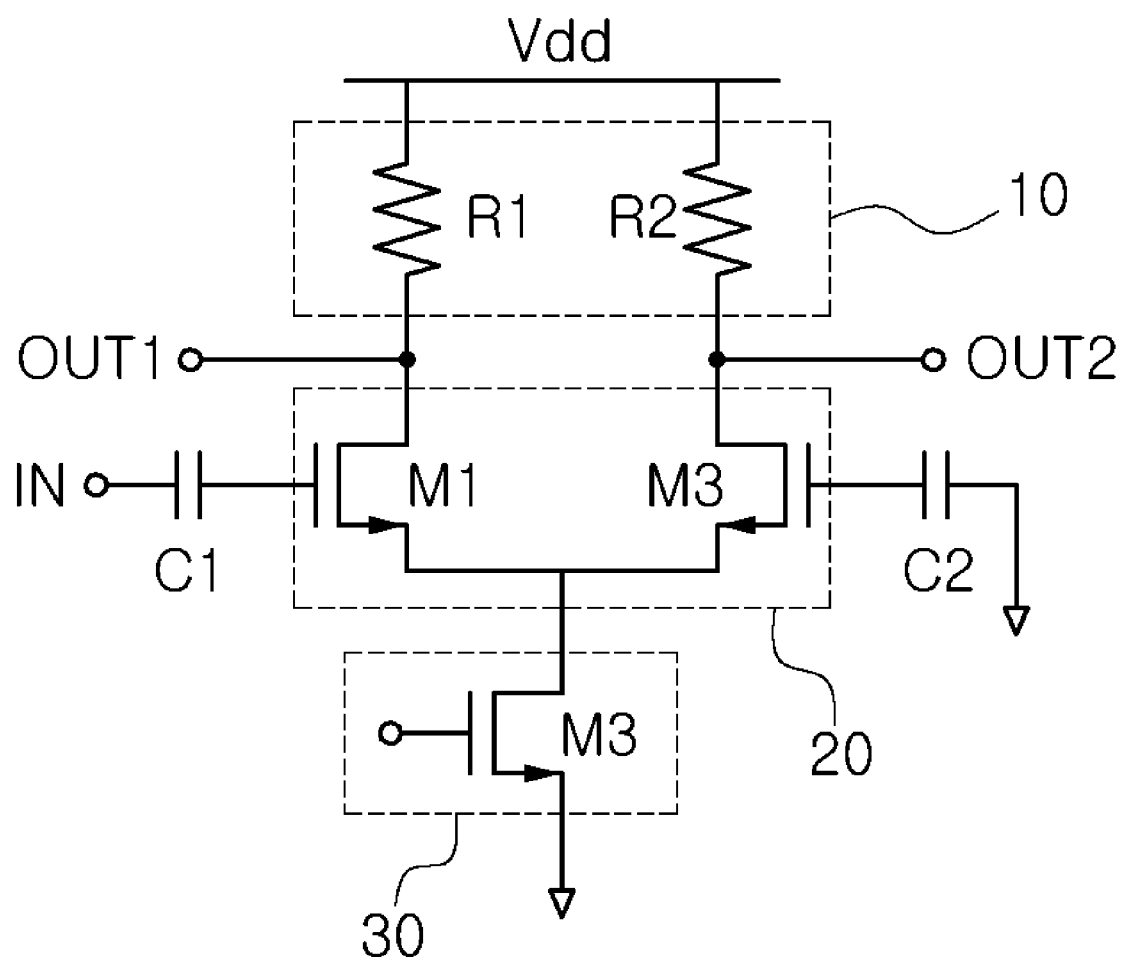
FIG. 1 is a configuration view illustrating an active balun circuit according to the related art.

Exemplary embodiments of the present invention will now be described in detail with reference to the accompanying drawings.

The invention may however be embodied in many different forms and should not be construed as limited to the embodiments set forth herein. Rather, these embodiments are provided so that this disclosure will be thorough and complete, and will fully convey the scope of the invention to those skilled in the art. Also, in the drawings, the same reference numerals are used throughout to designate the same components.

Figure 2:
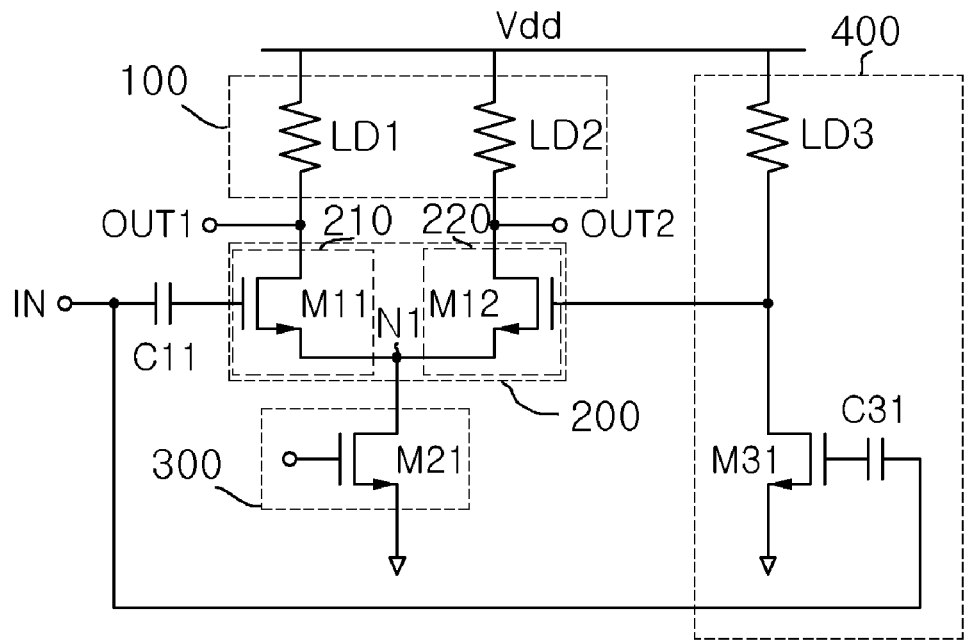
FIG. 2 is a configuration view illustrating an active balun circuit according to an exemplary embodiment of the invention.

FIG. 2 is a configuration view illustrating an active balun circuit according to an exemplary embodiment.

Referring to FIG. 2, an active balun circuit according to this embodiment includes a load circuit unit 100, a differential amplifying unit 200, a current source 300, and a compensation amplifying unit 400.

The load circuit unit 100 includes a first load LD1 and a second load LD2 that are connected in parallel with a power supply Vdd terminal. Here, each of the first and second loads LD1 and LD2 may be formed of a resistor or a coil.

The differential amplifying unit 200 includes a first amplifying unit 210 and a second amplifying unit 220. The first amplifying unit 210 is connected to the first load LD1 of the load circuit unit 100. The second amplifying unit 220 is connected to the second load LD2 of the load circuit unit 100. The second amplifying unit 220 and the first amplifying unit 210 constitute a differential amplifying circuit.

The differential amplifying unit 200 differentially amplifies an input signal, supplied through an input terminal IN, and outputs first and second output signals out-of-phase with each other through a first output terminal OUT1 and a second output terminal OUT2, respectively.

The current source 300 is connected between a ground and a common connection node N1 of the first and second amplifying units 210 and 220, and maintains a constant current flowing through the differential amplifying unit 200. Here, the current source 300 may be formed of a coil.

The compensation amplifying unit 400 amplifies the input signal, supplied through the input terminal IN, and transmits the amplified input signal to the second amplifying unit 220 to reject common mode noise of the differential amplifying unit 200.

Further, the first amplifying unit 210 includes a first MOS transistor M11 that has a drain connected to the first load LD1 of the load circuit unit 100, a gate connected to the input terminal IN through a capacitor C11, and a source connected to the common connection node N1.

The second amplifying unit 220 includes a second MOS transistor M12 that has a drain connected to the second load LD2 of the load circuit unit 100, a gate connected to the compensation amplifying unit 400, and a source connected to the common connection node N1.

Further, the compensation amplifying unit 400 includes a third load LD3 and a third MOS transistor M31. The third load LD3 is connected between the power supply Vdd terminal and the gate of the second MOS transistor M12. The third MOS transistor M31 has a drain connected to the gate of the second MOS transistor M12, a gate connected to the input terminal IN through a capacitor C31, and a source connected to a ground.

Here, the third load LD3 may be formed of a resistor or a coil.

Figure 3:
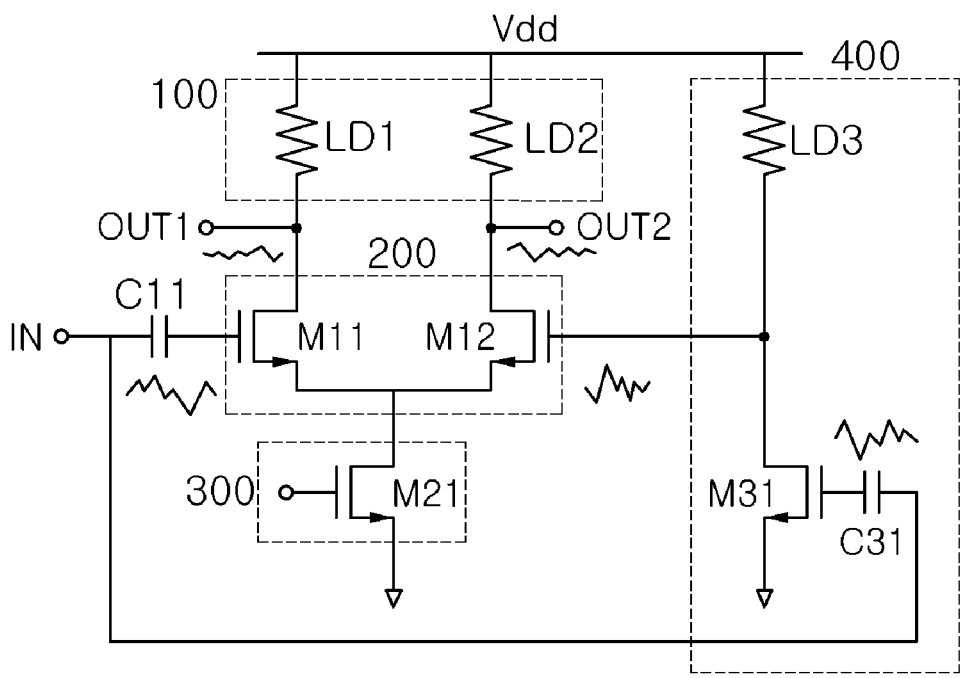
FIG. 3 illustrates waveforms of main signals of the active balun circuit and an active balun shown in FIG. 2.

FIG. 3 illustrates waveforms of main signals of the active balun circuit and an active balun shown in FIG. 2. Referring to FIG. 3, an input waveform of the first amplifying unit 210 and an input waveform of the second amplifying unit 220 are out-of-phase with each other. Here, the compensation amplifying unit 400 according to this embodiment amplifies the input waveform of the first amplifying unit 210 to compensate for the input waveform of the second amplifying unit 220.

Hereinafter, the operation and effect of the invention will be described in detail with reference to the accompanying drawings.

Referring to FIG. 2, the active balun circuit according to this embodiment includes the load circuit unit 100, the differential amplifying unit 200, the current source 300, and the compensation amplifying unit 400. The load circuit unit 100 includes the first load LD1 and the second load LD2 that are connected in parallel with the power supply Vdd terminal, and determines an amplification gain of differential amplifying unit 200.

The differential amplifying unit 200 includes the first amplifying unit 210 connected to the first load LD1 of the load circuit unit 100 and the second amplifying unit 220 connected to the second load LD2 of the load circuit unit 100. The first and second amplifying units 210 and 220 differentially amplifies a signal that is input through the input terminal IN.

That is, the differential amplifying unit 200 differentially amplifies the input signal, supplied through the input terminal IN, and outputs first and second output signals out-of-phase with each other through the first and second output terminals OUT1 and OUT2, respectively.

Here, the current source 300 is connected between the ground and the common connection node N1 of the first and second amplifying units 210 and 220, and maintains a constant current flowing through the differential amplifying unit 200.

In particular, the compensation amplifying unit 400 according to this embodiment amplifies the input signal, supplied through the input terminal IN, and transmits the amplified input signal to the second amplifying unit 220 to compensate for the input waveform of the second amplifying unit 220. In this way, the compensation amplifying unit 400 according to this embodiment rejects common mode noise of the differential amplifying unit 200.

Specifically, as described above, when the first amplifying unit 210 is formed of the first MOS transistor M11, and the second amplifying unit 220 is formed of the second MOS transistor M12, the first and second MOS transistors M11 and M12 amplify the input signal, supplied through the input terminal IN, with the gain determined by the load of the load circuit unit 100, and output the first and second output signals, which are differential signals, through the first and second output terminals OUT1 and OUT2, respectively.

In the differential amplifying unit 200, resistance between the ground and the connection node N1 of the first and second MOS transistors M11 and M12 gradually decreases with high frequency. Therefore, an AC ground connection is not completely provided at high frequency. The signal that is output from the drain of the second MOS transistor M12 has smaller magnitude than the signal that is output from the drain of the first MOS transistor M11.

For this reason, in order to improve symmetry between the first and second output signals, it needs to compensate for the magnitude of the signal that is output through the gate or the drain of the second MOS transistor M12.

That is, when the compensation amplifying unit 400 includes the third MOS transistor M31, the third MOS transistor M31 amplifies the input signal, supplied through the input terminal IN, and transmits the amplified input signal to the gate of the second MOS transistor M12 to thereby compensate for the signal that is input through the gate of the second MOS transistor M12.

Referring to FIG. 3, the input waveform of the first amplifying unit 210 and the input waveform of the second amplifying unit 220 are out-of-phase with each other. Here, the compensation amplifying unit 400 according to this embodiment amplifies the input waveform of the first amplifying unit 210, and compensates for the input waveform of the second amplifying unit 220. In this way, the input waveform of the first amplifying unit 210 and the input waveform of the second amplifying unit 220 are out-of-phase with each other and have the same magnitude at the same time. As a result, the input waveform of the first amplifying unit 210 and the input waveform of the second amplifying unit 220 become differential signals that are symmetrical with each other.

As set forth above, according to the exemplary embodiment of the invention, symmetry between two complementary output signals can be improved by rejecting common mode noise.

Therefore, as compared with a balun using a resistor at a source terminal of an input transistor and a balun using a common gate transistor, the balun circuit according to the embodiment of the invention has improved noise characteristics. Further, high-frequency characteristics can be improved by controlling the magnitude of a differential output signal when an operating frequency increases to 1 GHz or more, so that the differential output signal having the same magnitude can be obtained during the high-frequency operation. Finally, because of a high common mode rejection ratio (CMRR), the balun circuit according to the embodiment has excellent common mode noise rejection to reject common mode noise that appears in input and power supply.

While the present invention has been shown and described in connection with the exemplary embodiments, it will be apparent to those skilled in the art that modifications and variations can be made without departing from the spirit and scope of the invention as defined by the appended claims.

What is claimed is:

1. An active balun circuit comprising:
    a load circuit unit including a first load and a second load connected in parallel to a power supply terminal;
    a differential amplifying unit including a first amplifying unit connected to the first load of the load circuit unit, and a second amplifying unit connected to the second load of the load circuit unit and forming a differential amplifying unit together with the first amplifying unit, the differential amplifying unit differentially amplifying an input signal supplied through an input terminal, and outputting first and second output signals out-of-phase with each other through first and second output terminals, respectively;
    a current source connected between a ground and a common connection node of the first and second amplifying units, and maintaining a constant amount of current flowing through the differential amplifying unit; and
    a compensation amplifying unit amplifying the input signal supplied through the input terminal, transmitting the amplified input signal to the second amplifying unit, and rejecting common mode noise of the differential amplifying unit.

2. The active balun circuit of claim 1, wherein the first amplifying unit comprises a first MOS transistor having a drain connected to the first load of the load circuit unit, a gate connected to the input terminal through a capacitor, and a source connected to the common connection node, and
    the second amplifying unit comprises a second MOS transistor having a drain connected to the second load of the load circuit unit, a gate connected to the compensation amplifying unit, and a source connected to the common connection node.

3. The active balun circuit of claim 2, wherein the compensation amplifying unit comprises:
    a third load connected between the power supply terminal and the gate of the second MOS transistor; and
    a third MOS transistor having a drain connected to the gate of the second MOS transistor, a gate connected to the input terminal through a capacitor, and a source connected to a ground.

* * * * *